United States Patent
Ledbetter, III et al.

(10) Patent No.: US 9,086,447 B1
(45) Date of Patent: Jul. 21, 2015

(54) PORTABLE CIRCUIT BREAKER TEST AND CONTROL SYSTEM

(71) Applicant: VACUUM INTERRUPTERS, INC., Carrollton, TX (US)

(72) Inventors: Finley Lee Ledbetter, III, Carrollton, TX (US); Jerod Cole Day, Crossroads, TX (US)

(73) Assignee: VACUUM INTERRUPTERS, INC., Carrollton, TX (US)

( * ) Notice: Subject to any disclaimer, the term of this patent is extended or adjusted under 35 U.S.C. 154(b) by 0 days.

(21) Appl. No.: 14/488,614

(22) Filed: Sep. 17, 2014

(51) Int. Cl.
*G01R 31/327* (2006.01)
*G01R 31/28* (2006.01)

(52) U.S. Cl.
CPC ........ *G01R 31/2827* (2013.01); *G01R 31/3274* (2013.01); *G01R 31/3278* (2013.01)

(58) Field of Classification Search
CPC ........... G01R 31/3278; G01R 31/3336; G01R 31/3277; G01R 31/3272; G01R 31/06; G01R 31/3333; G01R 31/343; G01R 31/008; H02H 3/044; H02H 3/006; H02H 3/042; H02H 3/046; H01H 71/46; H01H 71/04; H01H 47/002; H01H 85/32; H01H 73/14; H01R 13/641
USPC ............. 324/418, 424; 340/635, 638; 200/52, 200/56, 50.39, 518
See application file for complete search history.

(56) References Cited

U.S. PATENT DOCUMENTS

| | | | | |
|---|---|---|---|---|
| 4,105,965 A | * | 8/1978 | Russell | 324/424 |
| 4,998,067 A | * | 3/1991 | Puckett et al. | 324/424 |
| 5,596,473 A | * | 1/1997 | Johnson et al. | 361/97 |
| 5,710,513 A | * | 1/1998 | March | 324/424 |
| 6,072,317 A | * | 6/2000 | Mackenzie | 324/536 |
| 6,184,689 B1 | * | 2/2001 | Shipley | 324/527 |
| 6,545,479 B1 | * | 4/2003 | Dollar et al. | 324/424 |
| 6,744,260 B2 | * | 6/2004 | Schmalz et al. | 324/555 |
| 7,057,401 B2 | * | 6/2006 | Blades | 324/713 |
| 7,176,811 B1 | * | 2/2007 | Parry | 340/945 |
| 7,804,201 B1 | * | 9/2010 | Ledbetter | 307/125 |
| 8,006,371 B1 | * | 8/2011 | Ledbetter | 29/622 |
| 8,228,225 B1 | * | 7/2012 | Ledbetter et al. | 341/176 |
| 8,294,305 B1 | * | 10/2012 | Ledbetter et al. | 307/125 |
| 8,466,584 B1 | * | 6/2013 | Ledbetter et al. | 307/125 |
| 2003/0090271 A1 | * | 5/2003 | Hurwicz | 324/424 |
| 2005/0110501 A1 | * | 5/2005 | Walker | 324/536 |
| 2006/0145714 A1 | * | 7/2006 | Cruz | 324/754 |
| 2007/0047161 A1 | * | 3/2007 | Mills et al. | 361/42 |

(Continued)

OTHER PUBLICATIONS

Vanguard, CT-8000 S3 digital circuit breaker analzyer, Vanguard Instruments Company, Inc., Jul. 2013.*

(Continued)

*Primary Examiner* — Patrick Assouad
*Assistant Examiner* — Sean Curtis
(74) *Attorney, Agent, or Firm* — Buskop Law Group, PC; Wendy Buskop

(57) ABSTRACT

A portable test and control system for selectively testing and operating an electrically operated switch with at least one phase, the electrically operated switch designed to protect electrical circuit. The portable test and control system is adapted for simultaneously performing verification that the electrically operated switch is operating according to stored switch specifications and control of operation of the electrically operated switch by providing power directly to the electrically operated switch.

16 Claims, 4 Drawing Sheets

(56) References Cited

U.S. PATENT DOCUMENTS

| | | | |
|---|---|---|---|
| 2010/0097074 A1* | 4/2010 | Schroeder et al. | 324/555 |
| 2013/0015928 A1* | 1/2013 | Sohn | 335/1 |
| 2013/0221973 A1* | 8/2013 | Whisenand et al. | 324/501 |
| 2013/0300423 A1* | 11/2013 | Klapper | 324/424 |

OTHER PUBLICATIONS

Doble, TDR9100 circuit breaker test sytem, Doble Engineering Company, Mar. 2012.*

Vanguard, CT-7000 S2 digital circuit breaker analyzer, Vanguard Instruments Company, Inc. Aug. 2012.*

Doble, TDR100 Circuit Breaker Test System, Doble Engineering Company, Sep. 2007.*

Vanguard, CT-7000 S2 digital circuit breaker analyzer, Vanguard Instruments Company, Inc., Aug. 2012.*

Vanguard, CT-8000 S3 digital circuit breaker analyzer, Vanguard Instruments Company, Inc., Jul. 2013.*

ISA, CBA-1000 circuit breaker analyzer and micoohmeter, ISA SRL, Oct. 2011.*

Doble, TDR900 circuit breaker test system, Doble Engineering Company, Apr. 2013.*

Doble, TDR9100 circuit breaker test system, Doble Engineering Company, Mar. 2012.*

* cited by examiner

PORTABLE CIRCUIT BREAKER TEST AND CONTROL SYSTEM

FIELD

The present embodiments generally relate to a device for simultaneously operating and testing an electrically operated switch, such as a circuit breaker.

BACKGROUND

Electrically operated switches, such as circuit breakers, require regular testing by maintenance personnel to ensure they are functioning properly. Circuit breakers also sometimes require testing to troubleshoot breaker malfunctions. During routine maintenance or breaker troubleshooting, a tester is coupled to each circuit breaker to test the functionality of the circuit breaker. Problems are diagnosed based on the test, and the circuit breaker is repaired or replaced as needed.

Some present-day testers are large and unwieldy, typically comprising a suitcase-sized box (e.g., eighteen inches by twelve inches by six inches). These testers can include a full-sized keyboard and display. These testers perform many tests on the circuit breakers, some of which may not be necessary to provide a reasonable diagnosis of the functionality of the circuit breaker. The size and complexity of these testers makes them difficult to use and transport in many applications, particularly when the maintenance personnel must travel to the work site.

Accordingly, a need exists for a portable test and control system which can test a circuit breaker for contact positions and open time and close time, as well as test other electrically operated switches.

A need exists for a versatile testing device that can be connected without the need for special adapters to a variety of circuit breakers and electrically operated switches for testing.

A need exists for a testing device for testing electrically operated switches while operating the electrically operated switch simultaneously.

The present embodiments meet these needs.

BRIEF DESCRIPTION OF THE DRAWINGS

The detailed description will be better understood in conjunction with the accompanying drawings as follows.

Figure 1:
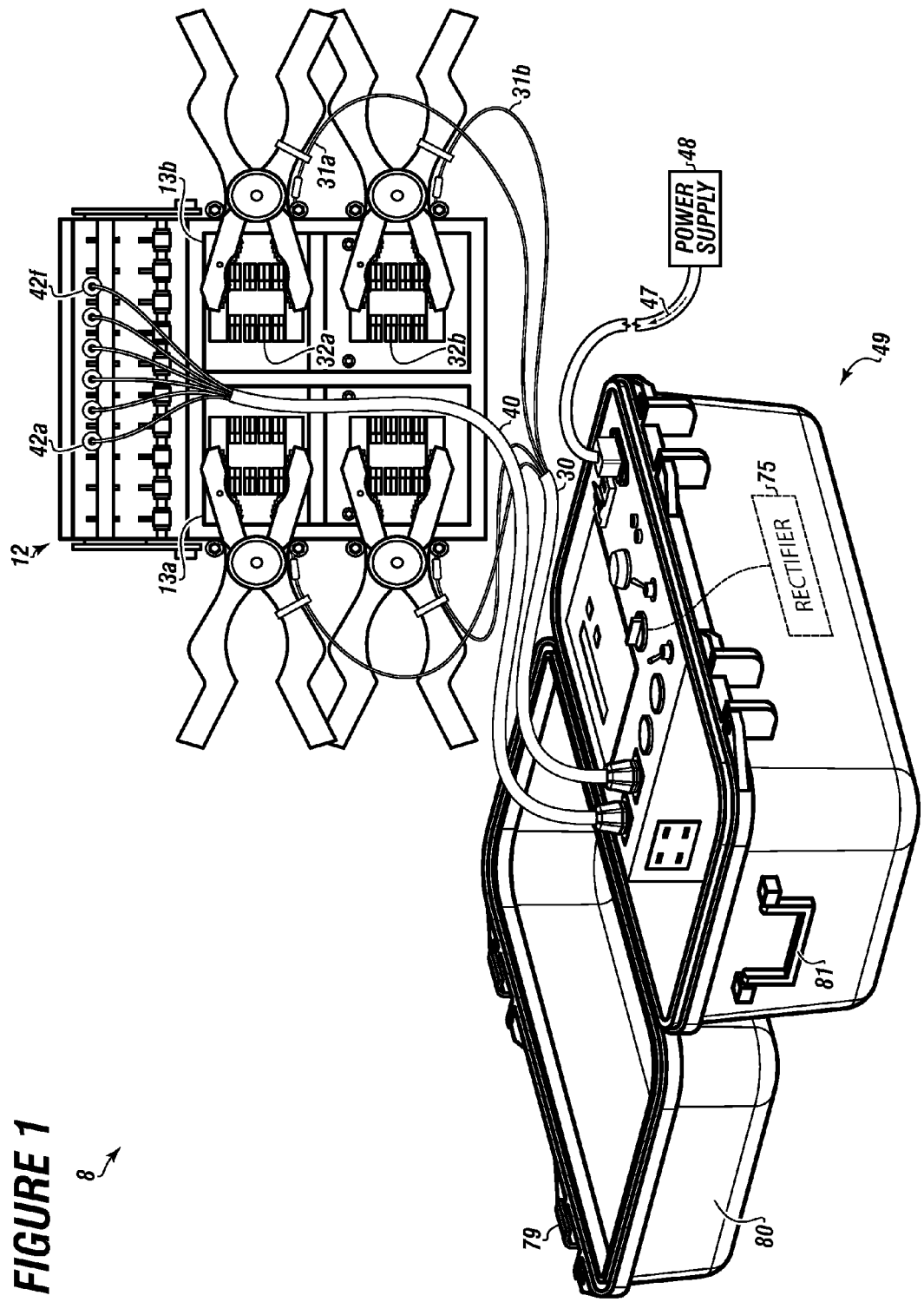
FIG. 1 depicts an overview of an embodiment of the portable test and control system.

The present embodiments are detailed below with reference to the listed Figures.

DETAILED DESCRIPTION OF THE EMBODIMENTS

Before explaining the present apparatus in detail, it is to be understood that the apparatus is not limited to the particular embodiments and that it can be practiced or carried out in various ways.

The present embodiments relate to portable test and control systems for selectively testing and operating an electrically operated switch designed to protect electrical circuits.

The systems use a sensor cable and a voltage cable to provide three separate voltages to the electrically operated switch, namely, an open/trip control voltage, a close control voltage, and a charge motor voltage.

The systems include an all-in-one test and control device to energize and test the electrically operated switch using a processor.

The processor undertakes the test using an open/trip operation phase timer adapted to measure time from actuation of an open/trip switch on the all-in-one test and control device until contacts change state.

The processor undertakes testing the electrically operated switch, such as a circuit breaker, using a phase timer adapted to measure time from actuation of a close switch on the all-in-one test and control device until contacts change state. The term "circuit breaker" as used herein refers to a multiphase electrically operated switch as is known in the relevant art.

The processor undertakes testing the electrically operated switch, such as a circuit breaker, using a phase timer adapted to measure time between when contacts start bouncing and when contacts stop bouncing, typically in milliseconds.

The embodied systems simultaneously perform two steps using one system without extra parts that are (i) verification that the electrically operated switch is operating according to switch specifications; and (ii) control of operation of the electrically operated switch by providing power directly to the electrically operated switch without using an additional power supply.

A benefit of the present embodiments is that the system can test an electrically operated switch like a circuit breaker and can also run the electrically operated switch without the need for a secondary power supply.

A benefit of the present embodiments is that the system has a timer that can configure and reconfigure to match hundreds of different circuit breaker controls by simply using a cable and secondary matching plug with a plurality of connectors in the plug making matching simple and easy to execute without complicated training or other special parts.

Another benefit of the present embodiments is that the system can open and close most circuit breakers without the need for an external power supply.

Still another benefit of the present embodiments is the that the system can record circuit breaker open times, circuit breaker close times, and circuit breaker bounce times and simultaneously act as a reconfigured power supply.

The present embodiments aid the circuit breaker technician or owner of the circuit breaker by allowing the technician or owner to plug this system into the existing circuit breaker equipment to open, charge, and/or close the existing circuit breaker. The embodiments can also record times as well as display the times for easy viewing at the moment of the test.

Another benefit of the present embodiments is the system can reconfigure easily, without special instructions, to match any circuit breaker control mechanism using the unique switch specific connector.

The versatility of the system has as a remarkable feature that testing and operation can be performed either in sequence or jointly using the same device on many circuit breakers without an adapter or extra pieces of equipment. The system provides a unique "all-in-one device" for attaching to cables and a versatile connector for powering a circuit breaker and testing a circuit breaker or similar electrically operated switch.

The embodied system can electrically operate an electrically operated switch, such as a circuit breaker, without having to directly actuate a switch on the circuit breaker or electrically operated switch.

The embodied system allows a user to verify the speed of opening and closing of an electrically operated switch, or circuit breaker, to validate or update arc flash studies.

The system can be adapted to verify that an electrically operated switch is operating according to switch specifications and/or to control operation of the electrically operated switch.

The embodied system is portable, easy to lift and user friendly and does not require a user to have any knowledge of electrical circuits to hook up or to use the embodied system for testing the electrically operated switch.

The system prevents death associated with arc flashing by allowing a user to verify the speed of opening and closing of an electrically operated switch, such as a circuit breaker, to validate or update arc flash studies.

For example, an arc flash study may have computed that the shortest safe distance from an electrical switch at 12 feet, and to be safe if the worst happens, an arc flash radius of 70 feet. If the test is run and the system fails then the arc flash radius may need to be larger than 70 feet, if nothing is fixed, enabling this portable circuit breaker test system to effectively save lives in a wide radius, particularly around chemical plants.

The lightweight construction aids in keeping the user from harming their back in carrying the system.

Turning now to the Figures, FIG. 1 depicts an overview of an embodiment of the portable test and control system. The portable test and control system 8 can be particularly usable for selectively testing and operating an electrically operated switch 12 designed to protect electrical circuits. The electrically operated switch 12 is depicted with two phases 13a and 13b.

The portable test and control system 8 can include a sensor cable 30 that can provide a plurality of conduction paths 31a and 31b for connection to the electrically operated switch 12. The first conduction path 31a can connect to a line side contact 32a and the second conduction path 31b can connect to a load side contact 32b of the electrically operated switch 12. The conduction paths can comprise sensor clamps as shown in the Figure.

The portable test and control system 8 can include a voltage cable 40 with a plurality of universal connectors 42a-42f. In embodiments, the universal connectors can provide close voltage, close common voltage, open/trip voltage, open/trip common voltage, charge motor voltage, and charge motor common voltage.

Figure 3:
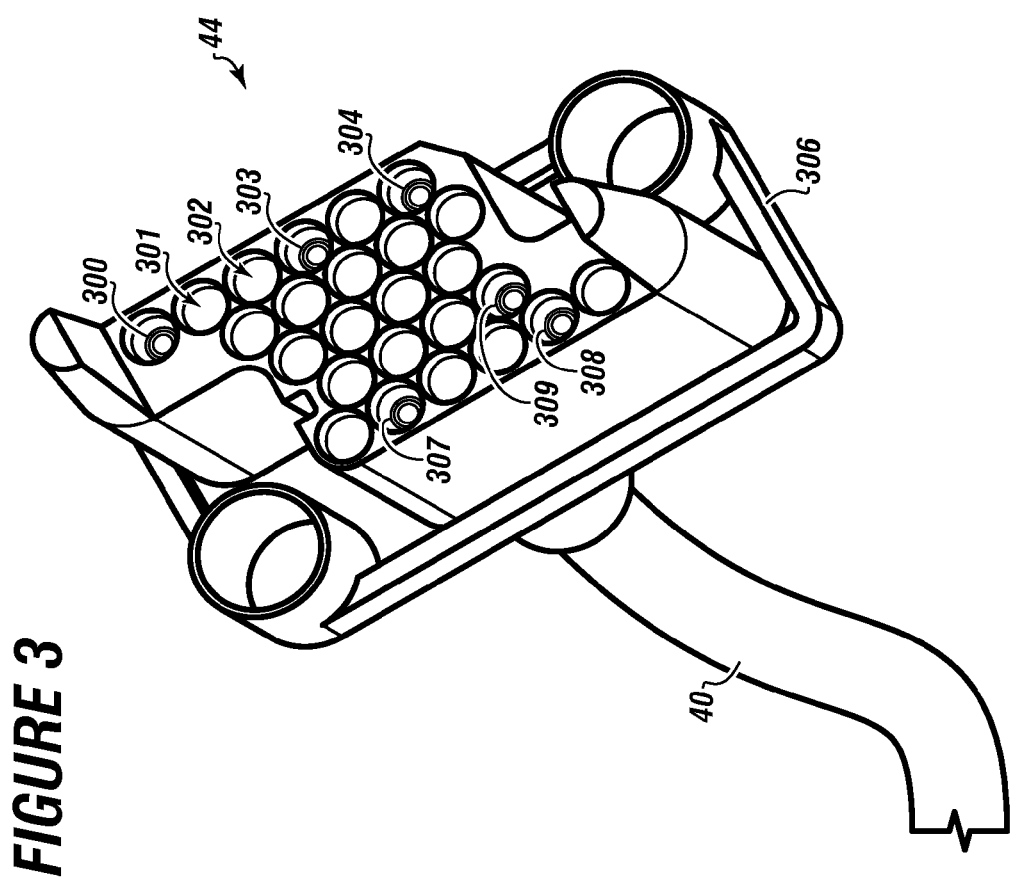
FIG. 3 depicts an isometric view of a unique switch specific connector usable as a replacement for the universal connectors shown in FIG. 1.

As an alternative to the universal connectors, a unique switch specific connector, as shown in FIG. 3, can be used with a specific circuit breaker or a specific electrically operated switch.

The voltage cable 40 can provide three separate voltages simultaneously: (i) an open/trip control voltage for testing the electrically operated switch; (ii) a close control voltage for testing the electrically operated switch; and (iii) a charge motor voltage for charging a stored energy device of the electrically operated switch.

The portable test and control system 8 can include an all-in-one test and control device 49. The all-in-one test and control device 49 can have a housing with at least one latch 79, a closable lid 80 and a pair of handles, of which handle 81 is shown. The handles can be used for ease of transporting the all-in-one test and control device 49 from one location to another location.

The all-in-one test and control device 49 can receive power 47 from a power supply 48. The all-in-one test and control device can transmit power to the voltage cable 40 to energize the electrically operated switch 12.

The portable test and control system 8 can operate on electrically operated switches which can control from 1 volt to 100 kilovolts.

The all-in-one test and control device 49 can include a rectifier 75 connected to a control power output switch for converting power to the control power output of the all-in-one test and control device.

Figure 2:
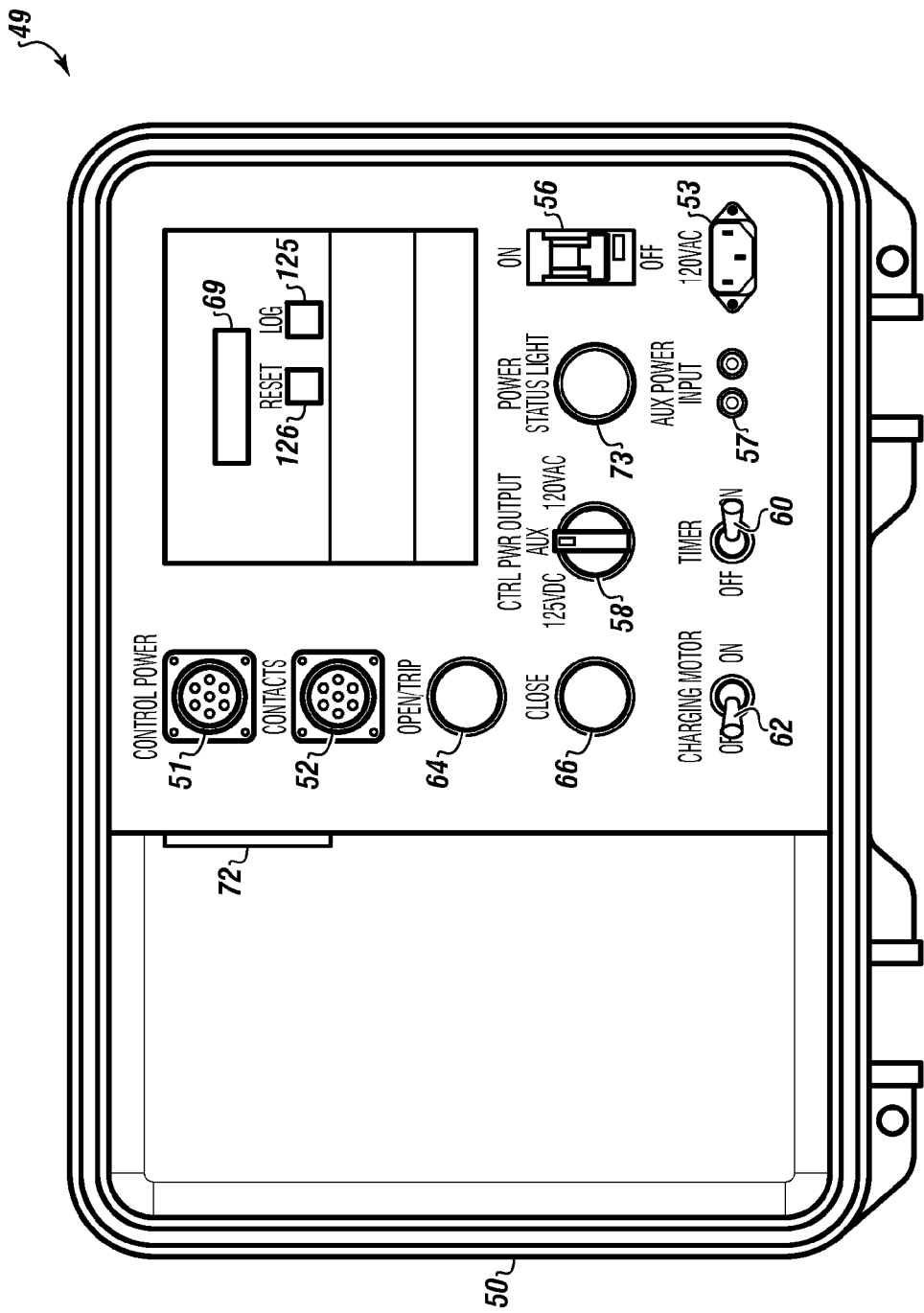
FIG. 2 depicts a top view of an embodiment of the all-in-one test and control device.

FIG. 2 depicts a top view of an embodiment of the all-in-one test and control device.

In embodiments, the all-in-one test and control device 49 can have an impact resistant water resistant housing 50.

The all-in-one test and control device 49 can include a sensor cable input 52 for engaging the sensor cable to receive sensor data from the electrically operated switch.

The all-in-one test and control device 49 can include a housing breaker 56 and a power input port 53. The power input port 53 is shown as a 120 VAC input for receiving the power from the power supply. The power input port 53 can transfer the power to the housing breaker 56.

The all-in-one test and control device 49 can include a control power output switch 58 electrically connected to the housing breaker 56. The control power output switch 58 is shown with settings of 125 volts of DC power (125 VDC), 120 volts of AC power (120 VAC) and AUX which represents any voltage other than the stated voltage, such as higher voltage up to 250 volts AC or DC.

The all-in-one test and control device 49 can include a charging motor switch 62 electrically connected between the control power output switch 58 and a control power output 51. The charging motor switch 62 can supply power to a circuit breaker, or if not a circuit breaker, the electrically operated switch.

The charging motor switch 62 can have an on position and an off position. The charging motor switch can provide power to a motor on an electrically operated switch, such as a circuit breaker, to charge a stored energy device, such as a spring, in the electrically operated switch.

The all-in-one test and control device 49 can include an open/trip switch 64 electrically connected between the control power output switch 58 and the control power output 51. The open/trip switch 64 can be adapted to control power to the control power output 51 for testing the electrically operated switch.

The all-in-one test and control device 49 can include a close switch 66 electrically connected between control power output 51 and the control power output switch 58. The close switch 66 can be adapted to control power to the control power output 51 for testing the electrically operated switch.

The all-in-one test and control device 49 can include a timer on/off switch 60 electrically positioned between the housing breaker 56 and a processor, which can be beneath a display 69. The timer on/off switch is shown with switchable controls, "on" and "off." The timer on/off switch can provide power to the processor, the display, and/or and sensor cable.

The all-in-one test and control device 49 can include a reset button 126 for clearing the display 69. The reset button 126 can be in communication with the processor.

The all-in-one test and control device 49 can include a log button 125 in communication with the processor. When the log button is depressed, the processor retrieves historical stored test information and presents the historical test information on the display 69.

In embodiments, when both the reset button 126 and the log button 125 are simultaneously depressed, all logs are deleted.

The all-in-one test and control device 49 can include a USB port 72 enabling the processor to transmit test data to another client device using a network or to a USB storage device, such as a removable jump drive.

The all-in-one test and control device 49 can include a power status light 73 electrically connected between the housing breaker 56 and the control power output switch 58 to indicate power is available to test or control the electrically operated switch by the all-in-one test and control device 49.

The all-in-one test and control device 49 can include an auxiliary power supply input 57 for providing a second source of power to the all-in-one test and control device 49 as an additional power supply for the control power output switch. This auxiliary power supply is a supplement to the original power supply.

The portable test and control system can be adapted for simultaneously performing two tasks: the verification that the electrically operated switch is operating according to switch specifications; and the control of operation of the electrically operated switch by providing power directly to a motor, a solenoid, another actuator, such as a linear actuator, to release the energy of a spring or other stored energy device of the electrically operated switch, or combinations thereof.

FIG. 3 depicts an isometric view of a unique switch specific connector usable as a replacement for the universal connectors shown in FIG. 1.

The unique switch specific connector 44 can attach to the voltage cable 40 and can be used for engaging an electrically operable switch.

The unique switch specific connector 44 can have a connector housing 306. The connector housing 306 can contain versatile matching wiring controls of the electrically operated switch.

More specifically, the housing can have at least one open pin 300, a plurality of pinless openings 301 and 302, a close pin 303, a charging motor pin 304, an open common pin 307, a close common pin 308 and a charging motor common pin 309.

Figure 4:
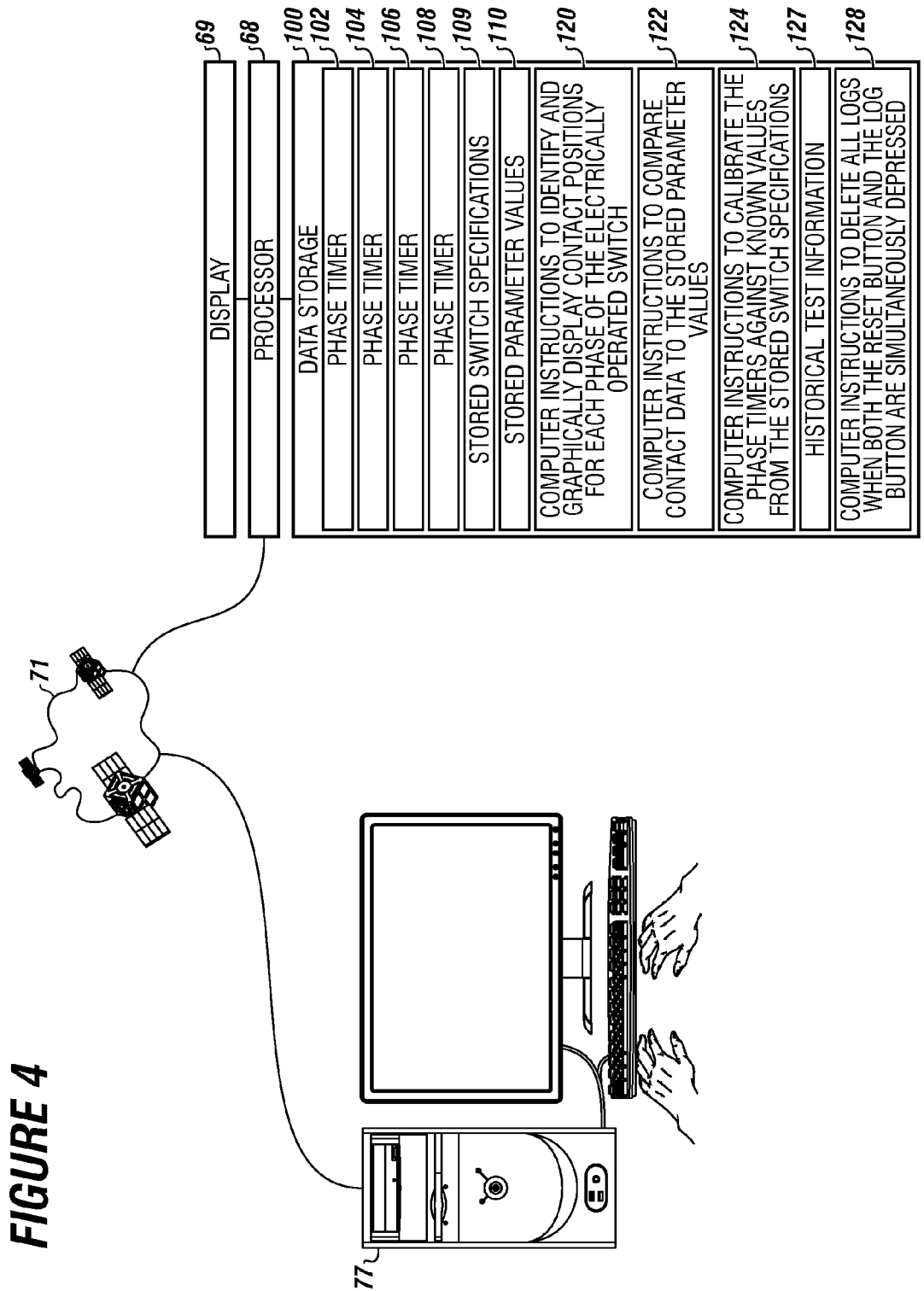
FIG. 4 depicts an embodiment of a processor with display and data storage to operate the portable test and control system and connect to a network.

FIG. 4 depicts an embodiment of the processor with the display and data storage to operate the portable test and control system and connect to a network.

The processor 68 can be coupled to the sensor cable. The processor can be a computer, a programmable logic circuit, or a portable two way communication device, such as a tablet computer. The processor can be adapted to continuously receive power and sensor data from the sensor cable.

The processor 68 can be in communication with a network 71 which can communicate with a client device 77. The network can be the internet, a global communication network, a satellite network, a cellular network, a similar network, or combinations of these networks. The client device can be a computer, a laptop, a cellular phone, a tablet, or another device capable of receiving and displaying the test data from the system using the network.

The processor 68 can also connect to the display 69 and a data storage 100. The term "data storage" refers to a non-transitory computer readable medium, such as a hard disk drive, solid state drive, flash drive, tape drive, and the like. The term "non-transitory computer readable medium" excludes any transitory signals but includes any non-transitory data storage circuitry, e.g., buffers, cache, and queues, within transceivers of transitory signals.

The data storage 100 can include at least one phase timer. The first phase timer 102 can be used to measure intervals being tested on one phase of the electrically operated switch. Additional phase timers are also shown as phase timers 104, 106 and 108. If the electrically operated switch has three phases, then three phase timers can be used.

Each phase timer can be used specifically for measuring time for each phase of the electrically operated switch. Each phase timer can measure time from: transmission of a signal when the open/trip switch is actuated until contacts in the electrically operated switch change state; transmission of a signal when the close switch is actuated until contacts in the electrically operated switch change state; and a moment when contacts on the electrically operated switch start bouncing until the contacts stop bouncing at a final position. The phase timers can measure in milliseconds.

The data storage 100 can include one or more stored switch specifications 109. An example of a switch specification can be a switch VCP-W circuit breaker by Westinghouse with a three phase circuit breaker that has an opening time of 40 milliseconds, a closing time of 70 milliseconds, and a bounce time of less than 2 milliseconds.

The data storage 100 can include stored parameter values 110 for a plurality of electrically operated switches. For example, a stored parameter value for a particular electrically operated switch can be that the normal maximum time difference between all three phases of the electrically operated switch should be no more than 2 milliseconds.

The data storage 100 can include computer instructions 120 to identify and graphically display contact positions for each phase of the electrically operated switch.

The data storage 100 can include computer instructions 122 to compare contact data to the stored parameter values. These computer instructions can be used to obtain an indication of health of at least one contact pair of a phase of the electrically operated switch using data from the sensor cable.

The data storage 100 can include computer instructions 124 to calibrate the phase timers against known values from the stored switch specifications.

The data storage 100 can include historical test information 127 from tests performed on the electrically operated switch by the portable test and control system.

The data storage 100 can include computer instructions 128 to delete all logs when both the reset button and the log button are simultaneously depressed.

The processor can be in communication with the network to transmit test times to at least one client device for remote display and monitoring.

In embodiments, the unique switch specific connector can be used with versatile matching wiring controls to a circuit breaker or electrically operated switch.

This unique switch specific connector is helpful because no technical skill is required to install the power side of the portable device for selectively testing and operating an electrically operated switch.

The embodied device enables a user to verify maintenance and lubrication policies for a circuit breaker or an electrically operated switch and determine and if the circuit breaker or the electrically operated switch is working by measuring operation times.

In embodiments, the voltage for testing and operation comes from a power supply plugged into a power input port in the impact resistant water resistant housing. The path the power takes depends on the position of the control power output switch.

If the control power output switch is at 120 VAC position, the power from the power supply passes through the housing from the power input port to the housing breaker to the control power output switch, then passes through the open/trip switch and the close switch simultaneously on parallel circuits to the control power output and then to the voltage cable for operating the electrically operated switch.

If the control power output switch is at 125 VDC position, the power from the power supply passes from the power input port to the housing breaker to the control power output switch, then through the rectifier, such as a DC rectifier. The rectifier converts the 120 volt AC power to 125 VDC, and then the 125 VDC power passes through the open/trip switch and the close switch simultaneously on parallel circuits to the control power output and to the voltage cable for operating the electrically operated switch.

The non-testing aspect of the system involves operating the electrically operated switch with the portable test and control system.

If the position of the contacts of the electrically operated switch is open by depressing the close switch, the state of the electrically operated switch is changed.

If the position of the contacts of the switch is closed by depressing the open/trip switch, the state of the electrically operated switch is changed.

The testing aspect of the system involves operating the electrically operated switch. If the position of the contacts of the electrically operated switch is opened by depressing the close switch, one or more phase timers are started in the processor, which can be a microprocessor, to measure a time from when the close switch is pushed until contacts of the electrically operated switch change state, typically in milliseconds (ms).

When the close switch is depressed, an electrical signal is sent to the electrically operated switch to change the state of the electrically operated switch.

The sensors are used to continuously detect a lack of voltage. When voltage is detected, one or more phase timers stop and the time interval is saved. If bounce occurs, the processor restarts the phase timer corresponding to the bounce and calculates the time until contacts stop bouncing. The phase timer runs until the voltage is constant without further bouncing.

If the position of the contacts of the electrically operated switch is closed by depressing the open/trip switch, the state of the electrically operated switch is also changed.

The sensors continuously detect a voltage and when lack of voltage is detected, the plurality of phase timers stop and the measured time is displayed on the display of the housing.

By depressing the close switch, a signal is sent to a motor, a solenoid, or an actuator of an electrically operated switch that allows a spring or other stored energy device to release energy and close the electrically operated switch.

The embodied systems are portable. The embodied systems can be composed of rugged construction.

With these embodiments, the portable test and control system is user friendly to common users so the simple breakers timing tests can be conducted accurately without requiring extensive training for an operator.

The use of breaker specific plugs adds consistency and ease of operation since the user does not need a diagram and valuable time to figure out setup and hookup configurations.

While these embodiments have been described with emphasis on the embodiments, it should be understood that within the scope of the appended claims, the embodiments might be practiced other than as specifically described herein.

What is claimed is:

1. A portable test and control system for selectively testing and operating an electrically operated switch with at least one phase, the electrically operated switch designed to protect electrical circuits, the portable test and control system comprising:

a. a sensor cable providing a plurality of conduction paths, wherein the plurality of conduction paths comprises a first conduction path connected to a line side contact of the electrically operated switch and a second conduction path connected to a load side contact of the electrically operated switch;

b. a voltage cable comprising a plurality of universal connectors or a unique switch specific connector; and wherein the voltage cable provides:
 (i) an open/trip control voltage for testing the electrically operated switch;
 (ii) a close control voltage for testing the electrically operated switch; and
 (iii) a charge motor voltage for powering a motor of the electrically operated switch for charging a stored energy device of the electrically operated switch; and c. an all-in-one test and control device adapted to receive power from a power supply and transmit power to the voltage cable, the all-in-one test and control device comprising:
 (i) an impact resistant water resistant housing;
 (ii) a sensor cable input for engaging the sensor cable to receive sensor data from the electrically operated switch;
 (iii) a charging motor switch for receiving power, the charging motor switch adapted to supply power to the motor on an electrically operated switch to charge the stored energy device in the electrically operated switch;
 (iv) an open/trip switch for receiving the power, wherein the open/trip switch is adapted to control incoming power to a control power output;
 (v) an auxiliary power supply input for providing a second source of power to the all-in-one test and control device;
 (vi) a close switch for receiving power, wherein the close switch is adapted to control incoming power to the control power output; and
 (vii) a processor in communication with a display, wherein the processor is coupled to the sensor cable, and wherein the processor is in communication with a data storage, the data storage comprising:
  (1) at least one phase timer for measuring time for each phase of an electrically operated switch, wherein the at least one phase timer measures time from:
   (a) transmission of a signal when the open/trip switch is actuated until contacts in the electrically operated switch change state;
   (b) transmission of a signal when the close switch is actuated until contacts in the electrically operated switch change state; and
   (c) a moment when contacts on the electrically operated switch start bouncing until the contacts stop bouncing at a final position; and
  (2) non-transitory computer instructions to identify and graphically display contact positions for each phase of the electrically operated switch; and wherein the portable test and control system is adapted for simultaneously performing verification that the electrically operated switch is operating according to stored switch specifications and control of operation of the electrically operated switch by providing power directly to the electrically operated switch.

2. The portable test and control system of claim 1, comprising a control power output switch electrically connected to a housing breaker for selectively providing different control voltages depending on the type of electrically operated switch from power.

3. The portable test and control system of claim 2, wherein the housing breaker is positioned between a power input port for receiving the power from the power supply and transferring the power to the control power output.

4. The portable test and control system of claim 1, comprising a USB port in the all-in-one test and control device enabling the processor to transmit test data to at least one client device using a network or using a USB storage device.

5. The portable test and control system of claim 2, comprising a power status light electrically connected between the housing breaker and the control power output to indicate power is available to test or control the electrically operated switch by the all-in-one test and control device.

6. The portable test and control system of claim 2, comprising a rectifier connected to the control power outlet switch for converting AC power to DC power and communicating the converted power at least one of: the open/trip switch, the close switch, and the charging motor switch.

7. The portable test and control system of claim 1, wherein the data storage comprises:
  c. stored switch specifications;
  d. stored parameter values for a plurality of electrically operated switches;
  e. non-transitory computer instructions to compare contact data to the stored parameter values to obtain an indication of health of at least one contact pair of a phase of the electrically operated switch using data from the sensor cable; and
  f. historical test information from tests performed on the electrically operated switch.

8. The portable test and control system of claim 7, comprising non-transitory computer instructions in the data storage to instruct the processor to calibrate the at least one phase timer for each phase of the electrically operated switch using known values from the stored switch specifications.

9. The portable test and control system of claim 1, wherein the impact resistant water resistant housing comprises at least one latch, a closable lid and a pair of handles for ease of transporting from one location to another location.

10. The portable test and control system of claim 1, wherein the data storage includes at least one additional phase timer.

11. The portable test and control system of claim 1, comprising a reset button in communication with the processor for clearing the display.

12. The portable test and control system of claim 11, comprising a log button to present historical test information from the data storage on the display.

13. The portable test and control system of claim 12, comprising non-transitory computer instructions to delete all logs when both the reset button and the log button are simultaneously depressed.

14. The portable test and control system of claim 1, wherein the unique switch specific connector engages the electrically operable switch, the unique switch specific connector comprising: a connector housing containing versatile matching wiring controls on the electrically operated switch, the connector housing comprising at least one open pin, a plurality of pinless openings, a close pin, a charging motor pin, an open common pin, a close common pin and a charging motor common pin.

15. A portable test and control system for selectively testing and operating an electrically operated switch with at least one phase, the electrically operated switch designed to protect electrical circuits, the portable test and control system comprising:
  a. a sensor cable providing a plurality of conduction paths, wherein the plurality of conduction paths comprises a first conduction path connected to a line side contact of the electrically operated switch and a second conduction path connected to a load side contact of the electrically operated switch;
  b. a voltage cable comprising a plurality of universal connectors or a unique switch specific connector; and wherein the voltage cable provides:
    (i) an open/trip control voltage for testing the electrically operated switch;
    (ii) a close control voltage for testing the electrically operated switch; and
    (iii) a charge motor voltage for powering a motor of the electrically operated switch for charging a stored energy device of the electrically operated switch;
  c. a control power output switch electrically connected to a housing breaker for selectively providing different control voltages depending on the type of electrically operated switch from power;
  d. a timer on/off switch electrically positioned between the housing breaker and a processor for selectively providing power to at least one of: the processor, a display, and the sensor cable; and
  e. an all-in-one test and control device adapted to receive power from a power supply and transmit power to the voltage cable, the all-in-one test and control device comprising:
    (i) an impact resistant water resistant housing;
    (ii) a sensor cable input for engaging the sensor cable to receive sensor data from the electrically operated switch;
    (iii) a charging motor switch for receiving power, the charging motor switch adapted to supply power to the motor on an electrically operated switch to charge the stored energy device in the electrically operated switch;
    (iv) an open/trip switch for receiving the power, wherein the open/trip switch is adapted to control incoming power to a control power output;
    (v) a close switch for receiving power, wherein the close switch is adapted to control incoming power to the control power output; and the processor in communication with the display, wherein the processor is coupled to the sensor cable, and wherein the processor is in communication with a data storage, the data storage comprising:
      (1) at least one phase timer for measuring time for each phase of an electrically operated switch, wherein the at least one phase timer measures time from:
        (a) transmission of a signal when the open/trip switch is actuated until contacts in the electrically operated switch change state;
        (b) transmission of a signal when the close switch is actuated until contacts in the electrically operated switch change state; and (c) a moment when contacts on the electrically operated switch start bouncing until the contacts stop bouncing at a final position; and (2) non-transitory computer instructions to identify and graphically display contact positions for each phase of the electrically operated switch; and wherein the portable test and control system is adapted for simultaneously performing verification that the electrically operated switch is operating according to stored switch specifications and control of operation of the electrically operated switch by providing power directly to the electrically operated switch.

16. A portable test and control system for selectively testing and operating an electrically operated switch with at least one phase, the electrically operated switch designed to protect electrical circuits, the portable test and control system comprising:

a. a sensor cable providing a plurality of conduction paths, wherein the plurality of conduction paths comprises a first conduction path connected to a line side contact of the electrically operated switch and a second conduction path connected to a load side contact of the electrically operated switch;

b. a voltage cable comprising a plurality of universal connectors or a unique switch specific connector; and wherein the voltage cable provides:
        (i) an open/trip control voltage for testing the electrically operated switch;
        (ii) a close control voltage for testing the electrically operated switch; and
        (iii) a charge motor voltage for powering a motor of the electrically operated switch for charging a stored energy device of the electrically operated switch; and c. an all-in-one test and control device adapted to receive power from a power supply and transmit power to the voltage cable, the all-in-one test and control device comprising:
        (i) an impact resistant water resistant housing;
        (ii) a sensor cable input for engaging the sensor cable to receive sensor data from the electrically operated switch;
        (iii) a charging motor switch for receiving power, the charging motor switch adapted to supply power to the motor on an electrically operated switch to charge the stored energy device in the electrically operated switch;
        (iv) an open/trip switch for receiving the power, wherein the open/trip switch is adapted to control incoming power to a control power output;
        (v) a close switch for receiving power, wherein the close switch is adapted to control incoming power to the control power output; and a processor in communication with a display, wherein the processor is coupled to the sensor cable, and wherein the processor is in communication with a data storage, the data storage comprising:
        (1) at least one phase timer for measuring time for each phase of an electrically operated switch, wherein the at least one phase timer measures time from:
            (a) transmission of a signal when the open/trip switch is actuated until contacts in the electrically operated switch change state;
            (b) transmission of a signal when the close switch is actuated until contacts in the electrically operated switch change state; and
            (c) a moment when contacts on the electrically operated switch start bouncing until the contacts stop bouncing at a final position; and
        (2) computer instructions to identify and graphically display contact positions for each phase of the electrically operated switch; and wherein the portable test and control system is adapted for simultaneously performing verification that the electrically operated switch is operating according to stored switch specifications and control of operation of the electrically operated switch by providing power directly to the electrically operated switch and wherein the portable test and control system operates on electrically operated switches which control from 1 volt to 100 kilovolts.

\* \* \* \* \*